(12) United States Patent
Konno et al.

(10) Patent No.: US 8,736,043 B2
(45) Date of Patent: May 27, 2014

(54) POWER DEVICE HAVING A SPECIFIC RANGE OF DISTANCES BETWEEN COLLECTOR AND EMITTER ELECTRODES

(75) Inventors: Akitoyo Konno, Hitachi (JP); Katsunori Azuma, Hitachi (JP); Takashi Ando, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 128 days.

(21) Appl. No.: 13/544,339

(22) Filed: Jul. 9, 2012

(65) Prior Publication Data

US 2013/0015496 A1    Jan. 17, 2013

(30) Foreign Application Priority Data

Jul. 11, 2011   (JP) .................................. 2011-152779

(51) Int. Cl.
| | |
|---|---|
| *H05K 1/03* | (2006.01) |
| *H01L 23/49* | (2006.01) |
| *H01L 25/07* | (2006.01) |
| *H01L 29/417* | (2006.01) |

(52) U.S. Cl.
CPC .............. *H01L 23/49* (2013.01); *H01L 25/072* (2013.01); *H01L 29/417* (2013.01)
USPC ........................................................ 257/693

(58) Field of Classification Search
CPC ................ H01L 23/048; H01L 23/049; H01L 23/49562; H01L 25/072; H01L 29/417
See application file for complete search history.

(56) References Cited

U.S. PATENT DOCUMENTS

| | | | |
|---|---|---|---|
| 5,761,040 A | 6/1998 | Iwasa et al. | |
| 6,441,317 B1* | 8/2002 | Tanaka et al. ................. | 174/260 |
| 2003/0016502 A1* | 1/2003 | Yamada et al. ............... | 361/705 |
| 2007/0051974 A1 | 3/2007 | Azuma et al. | |
| 2007/0109715 A1 | 5/2007 | Azuma et al. | |
| 2008/0049476 A1 | 2/2008 | Azuma et al. | |
| 2011/0051371 A1 | 3/2011 | Azuma et al. | |

FOREIGN PATENT DOCUMENTS

JP           9-172139 A       6/1997

* cited by examiner

*Primary Examiner* — Thomas L Dickey
(74) *Attorney, Agent, or Firm* — Crowell & Moring LLP

(57) ABSTRACT

A power semiconductor device is provided in which reliability can be improved when the parallel number of semiconductor devices increases. When a bonding face on collector electrode is on an upper side, and a bonding face on emitter electrode is on a lower side, a collector electrode joint region as a joint region between a collector trace and a collector electrode on a chip mounted substrate and an emitter electrode joint region as a joint region between an emitter trace and an emitter electrode are located at a same position in an up-and-down direction and are adjacent in a right-and-left direction at an interval of 2 mm or more and 4 mm or less.

13 Claims, 16 Drawing Sheets

FIG. 2
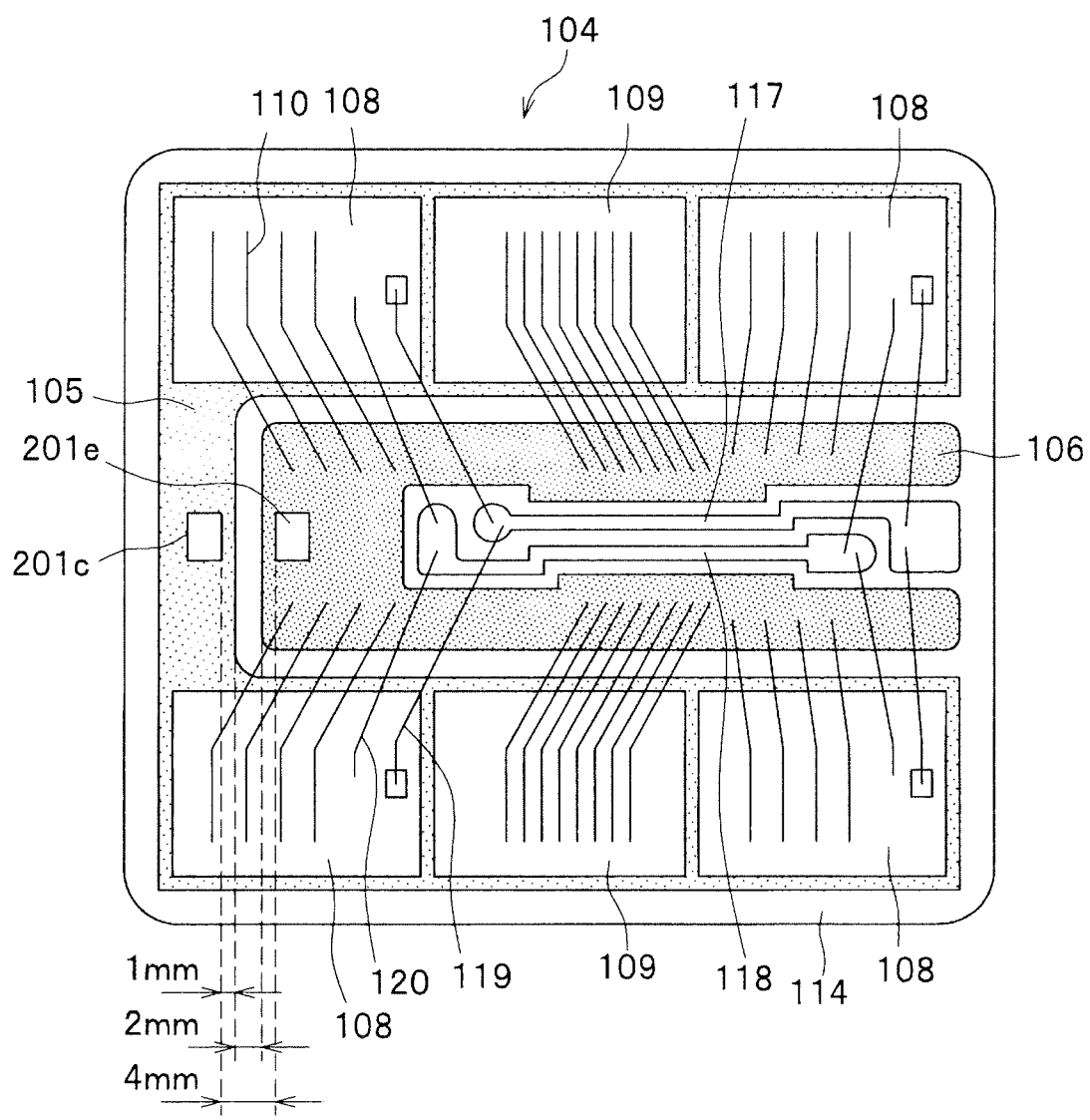
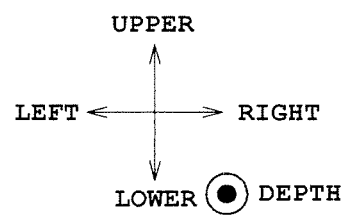

FIG. 12
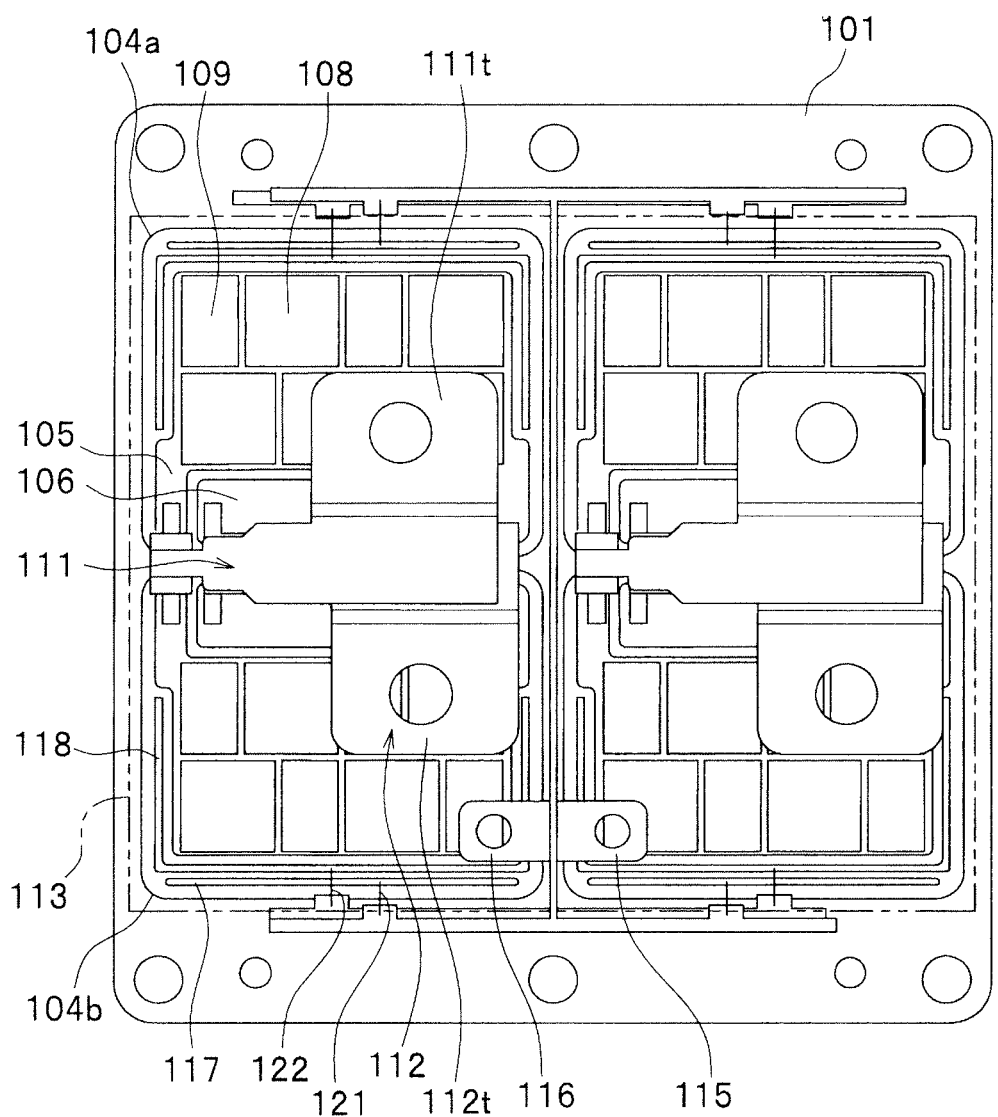
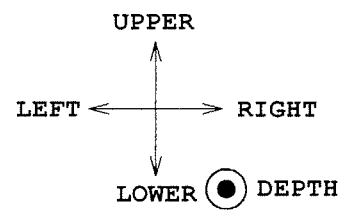

FIG. 13
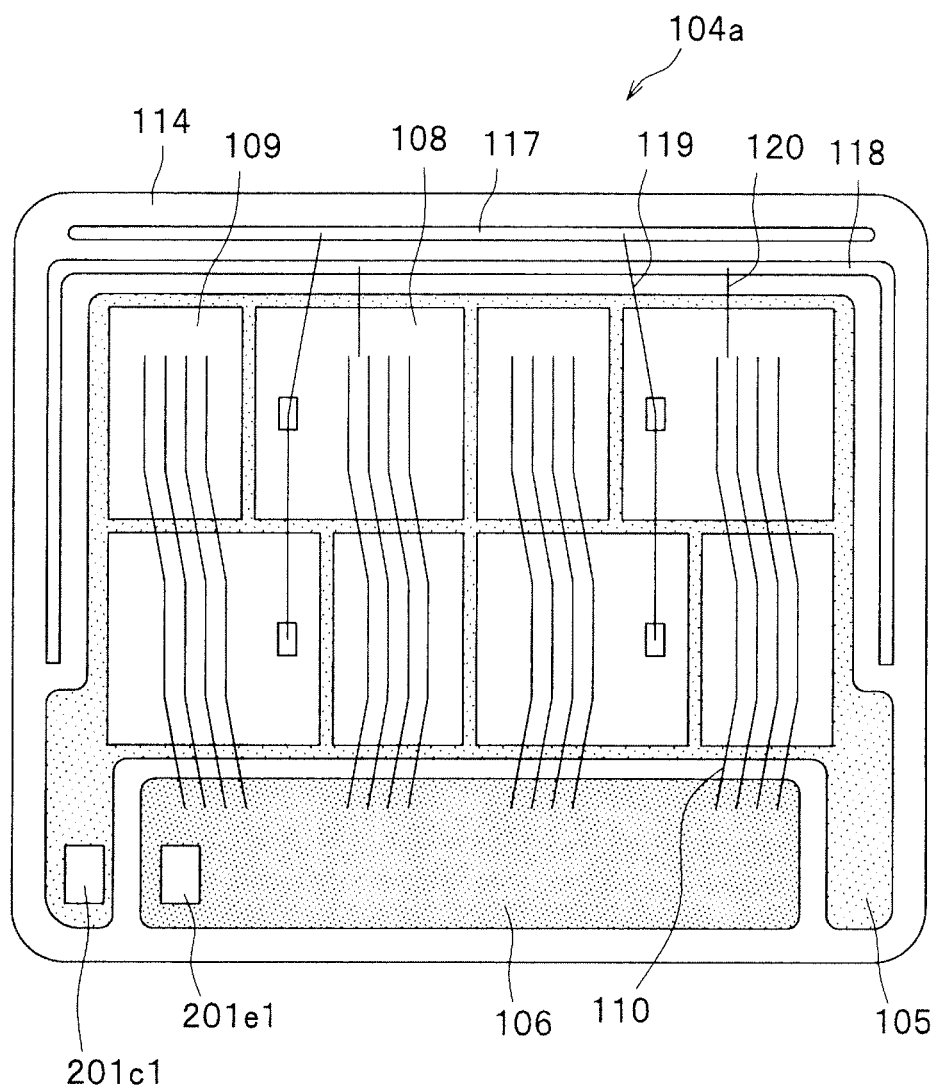
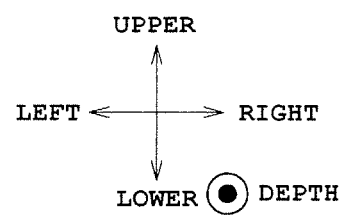

POWER DEVICE HAVING A SPECIFIC RANGE OF DISTANCES BETWEEN COLLECTOR AND EMITTER ELECTRODES

BACKGROUND OF THE INVENTION

1. Field of the Invention

The present invention relates to a power semiconductor device in which reliability can be improved when the number of parallel connection of semiconductor devices increases.

2. Description of the Related Art

A power semiconductor device has a function to convert DC power supplied from a DC power supply into AC power to be supplied to an inductive load such as a motor, or a function to convert AC power generated by a motor into DC power to be supplied to a DC power supply. In order to perform the conversion function, the power semiconductor device includes a power semiconductor device having a switching function, and repeats a conduction operation and an interrupting operation to perform power conversion from DC power to AC power or from AC power to DC power, and the power is controlled.

As related art, patent document 1 (JP-A-9-172139) disclose a technique as described below. Main electrode terminals are arranged to be aligned on almost the same straight line along the longitudinal direction of a resin case. One main surface (inside main surface) of each of the main electrode terminals faces the inside of a case main body part, that is, the side on which an insulating substrate is provided, and all the other main surfaces (outside main surfaces) face the outside of the case main body part, that is, the side opposite to the side on which the insulating substrate is provided. A conducting plate is arranged so that the main surface thereof faces the outside main surface of the main electrode terminal.

Patent document 1 discloses a structure in which two switching devices and two diodes, which are semiconductor devices, are connected in parallel on the insulating substrate (circuit substrate). In order to switch a large current, a circuit of a power semiconductor device is required to be constructed by connecting plural semiconductor devices in parallel correspondingly to the magnitude of the current. When the plural semiconductor devices are connected in parallel, and the parallel number increases, trace distances from electrode terminals as contact surfaces to external electrodes become different from each other, and because of this, a difference in parasitic inductance occurs, and there arises a problem that reliability of the semiconductor device deteriorates.

SUMMARY OF THE INVENTION

The invention is made to solve the above problem and its object is to provide a power semiconductor device in which reliability can be improved when the number of parallel connection of semiconductor devices increases.

According to an aspect of the invention, a power semiconductor device includes a first chip mounted substrate on which a switching device and a free wheeling diode are mounted, a second chip mounted substrate on which a switching device and a free wheeling diode (109) are mounted, a pair of a collector electrode and an emitter electrode to electrically parallelly connect collector traces and emitter traces on the two chip mounted substrates, and a filled insulating material. The collector electrode and the emitter electrode face each other, a first interval is provided outside the insulating material, and a second interval smaller than the first interval is provided inside the insulating material. When a collector electrode terminal is on an upper side and an emitter electrode terminal is on a lower side when viewed in plane, a collector electrode joint region as a joint region between the collector trace and the collector electrode on the chip mounted substrate and an emitter electrode joint region as a joint region between the emitter trace and the emitter electrode are located at a same position in an up-and-down direction and are adjacent in a right-and-left direction at an interval of 2 mm or more and 4 mm or less. The collector electrode joint region on the first chip mounted substrate arranged on the upper side and the collector electrode joint region on the second chip mounted substrate arranged on the lower side, and the emitter electrode joint region on the first chip mounted substrate and the emitter electrode joint region on the second chip mounted substrate are respectively arranged at a same position in the right-and-left direction.

According to the aspect of the invention, when the number of parallel connection of the semiconductor devices increases, the reliability can be improved.

BRIEF DESCRIPTION OF THE DRAWINGS

FIG. 2 is a plan view of a chip mounted substrate used in the power semiconductor device of the embodiment 1.

FIG. 12 is a plan view of the power semiconductor device of the embodiment 3.

FIG. 13 is a plan view of a chip mounted substrate used in the power semiconductor device of the embodiment 3.

DETAILED DESCRIPTION OF THE INVENTION

Hereinafter, embodiments of the invention will be described in detail with reference to the drawings.

Before the description of the embodiments, the problem of a power semiconductor device as an object will be described in detail. In the power semiconductor device, a chip mounted substrate on which a trace pattern is formed is joined to a heat sink base plate by solder or the like, and plural semiconductor devices are joined onto the trace pattern of the chip mounted substrate by solder or the like to form parallel connection. In a power device for high power used for a railroad or the like, plural such chip mounted substrates are mounted, so that parallel connection of many semiconductor devices is realized. At this time, in the respective chip mounted substrates, trace distances from electrode terminals are different from each other, and a difference in parasitic inductance occurs.

Incidentally, in the power semiconductor device used for a railroad, a current of, for example, 1200 A is required to be switched. In general, circuits formed on two chip mounted substrates are connected in parallel by a pair of a collector electrode and an emitter electrode, and is further connected in parallel by plural electrodes.

Figure 15:
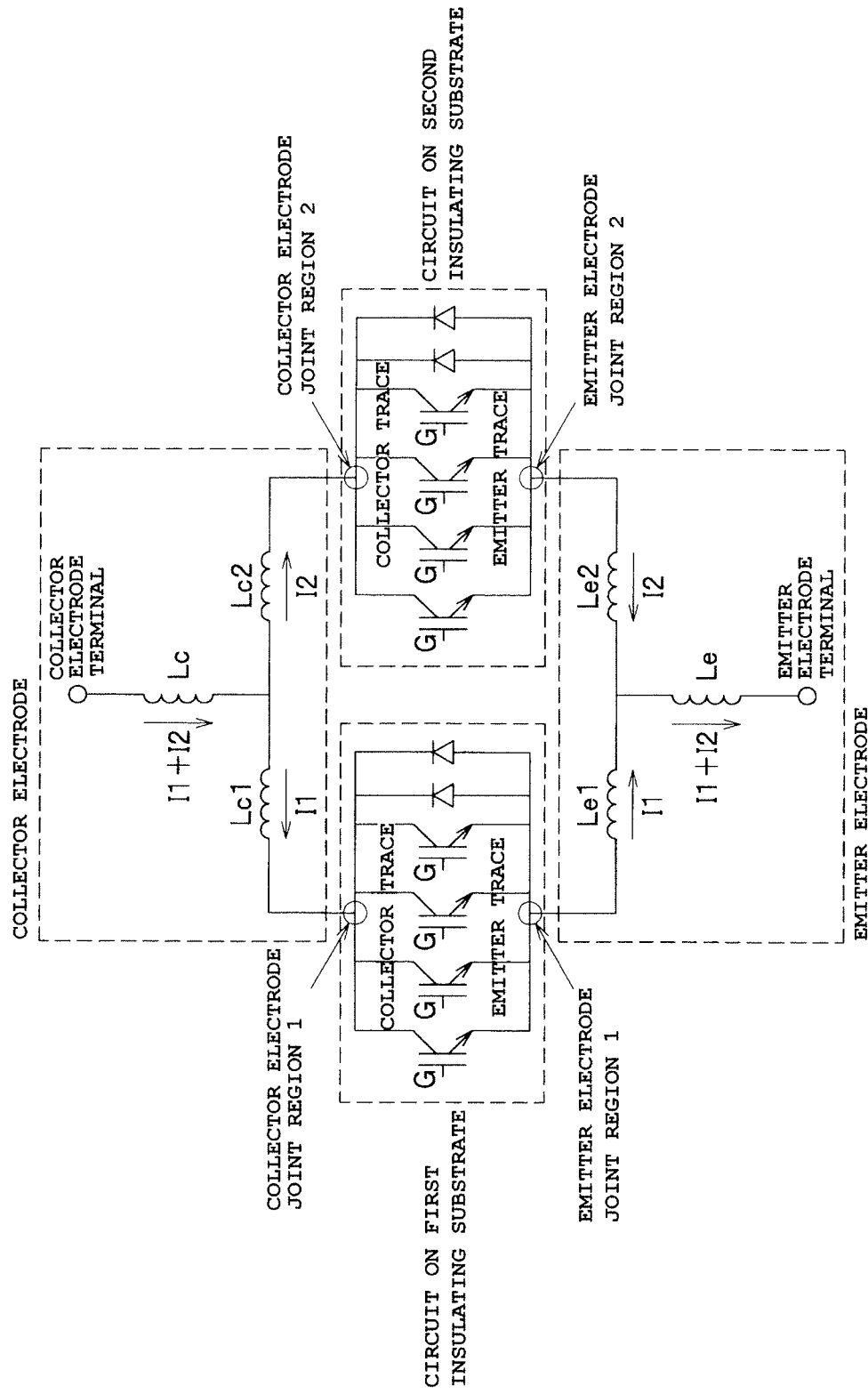
FIG. 15 is a schematic circuit view showing a pair formed of a collector electrode and an emitter electrode of a power semiconductor device.

FIG. 15 is a schematic circuit view of a pair made of a collector electrode and an emitter electrode of a power semiconductor device. Four IGBTs (Insulated Gate Bipolar Transistors) and two free wheeling diodes are mounted on each of chip mounted substrates (a first insulating substrate and a second insulating substrate). Since circuits on each of the chip mounted substrates are connected in parallel by the collector electrode and the emitter electrode, eight IGBTs and four free wheeling diodes are connected in parallel to the pair of the collector electrode and the emitter electrode. The collector electrode and the emitter electrode respectively include parasitic inductances Lc, Lc1 and Lc2 and Le, Le1 and Le2. The parasitic inductances can have a bad influence on the reliability of the power semiconductor device. First, the parasitic inductance generates an electromotive force by a current change, and the semiconductor device may be damaged by the electromotive force. Thus, the parasitic inductance must be reduced.

Besides, if the parasitic inductances between the electrode terminal and the circuits on the respective chip mounted substrates are different from each other, currents flowing into the circuits on the respective chip mounted substrates are different. Thus, heat generation is concentrated in the semiconductor device mounted in the circuit on one of the chip mounted substrates. As a result, the temperature of the semiconductor device in which heat generation is concentrated partially rises, and the reliability may deteriorate.

Besides, since the semiconductor devices mounted in the circuit on the chip mounted substrate are mutually heated by mutual heat generation, there is a point where the temperature partially becomes high according to the arrangement of the semiconductor devices. By this, the reliability may deteriorate.

In order to suppress the reliability deterioration factors, it is necessary that the electrode structure is made adequate, and the arrangement of electrode joint regions where the electrodes contact traces on the circuits and the semiconductor devices on the chip mounted substrates are made adequate.

Embodiment 1

Figure 1:
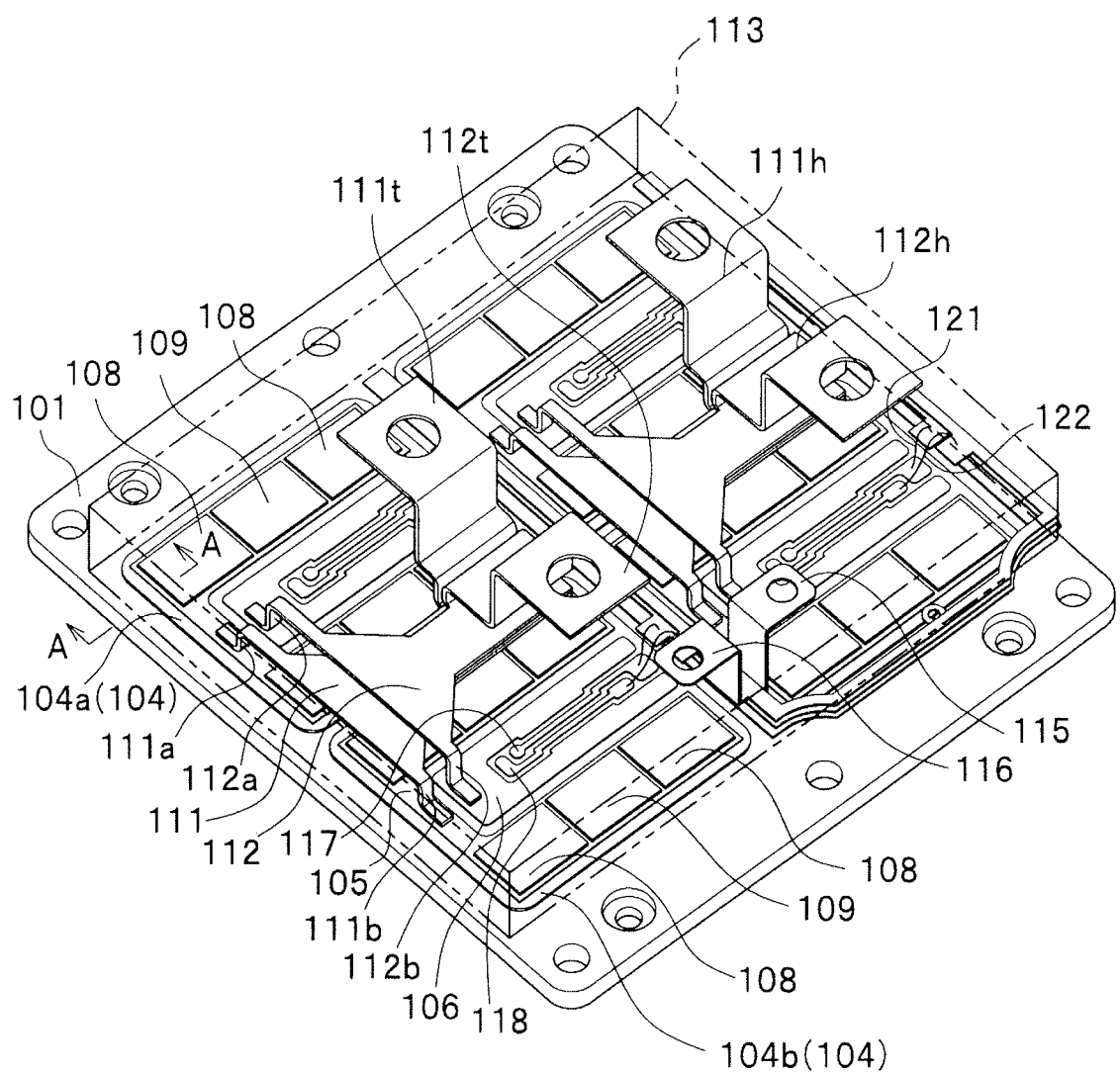
FIG. 1 is a perspective view of a power semiconductor device of embodiment 1.
Figure 3:
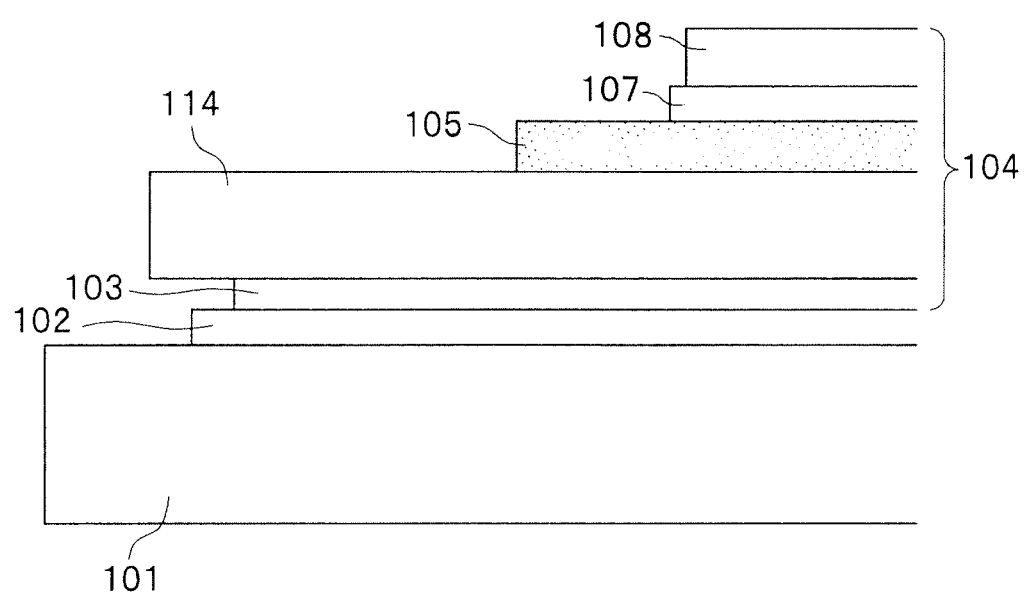
FIG. 3 is an enlarged side view of the chip mounted substrate used in the power semiconductor device of the embodiment 1.
Figure 4:
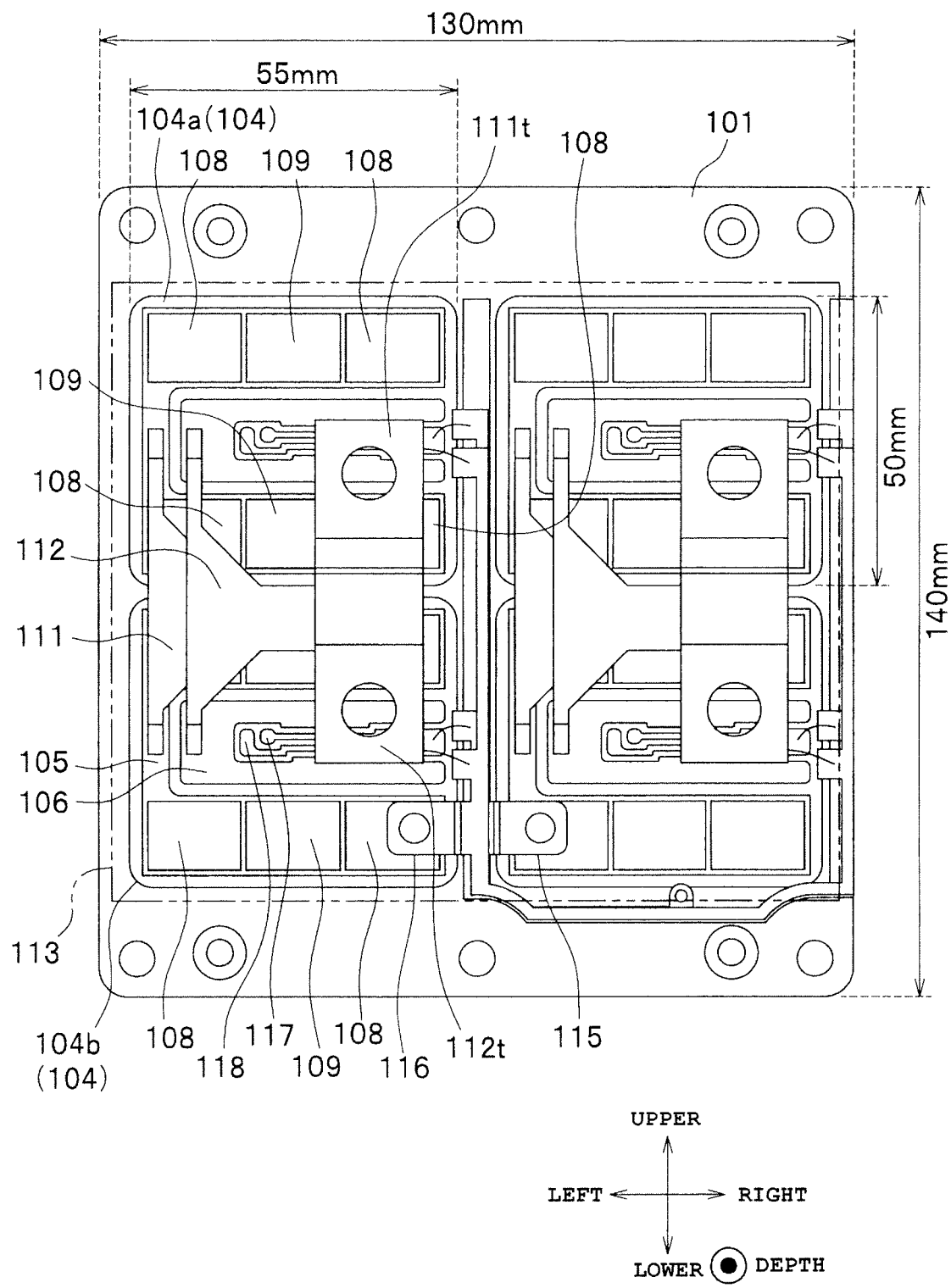
FIG. 4 is a plan view of the power semiconductor device of the embodiment 1.
Figure 5:
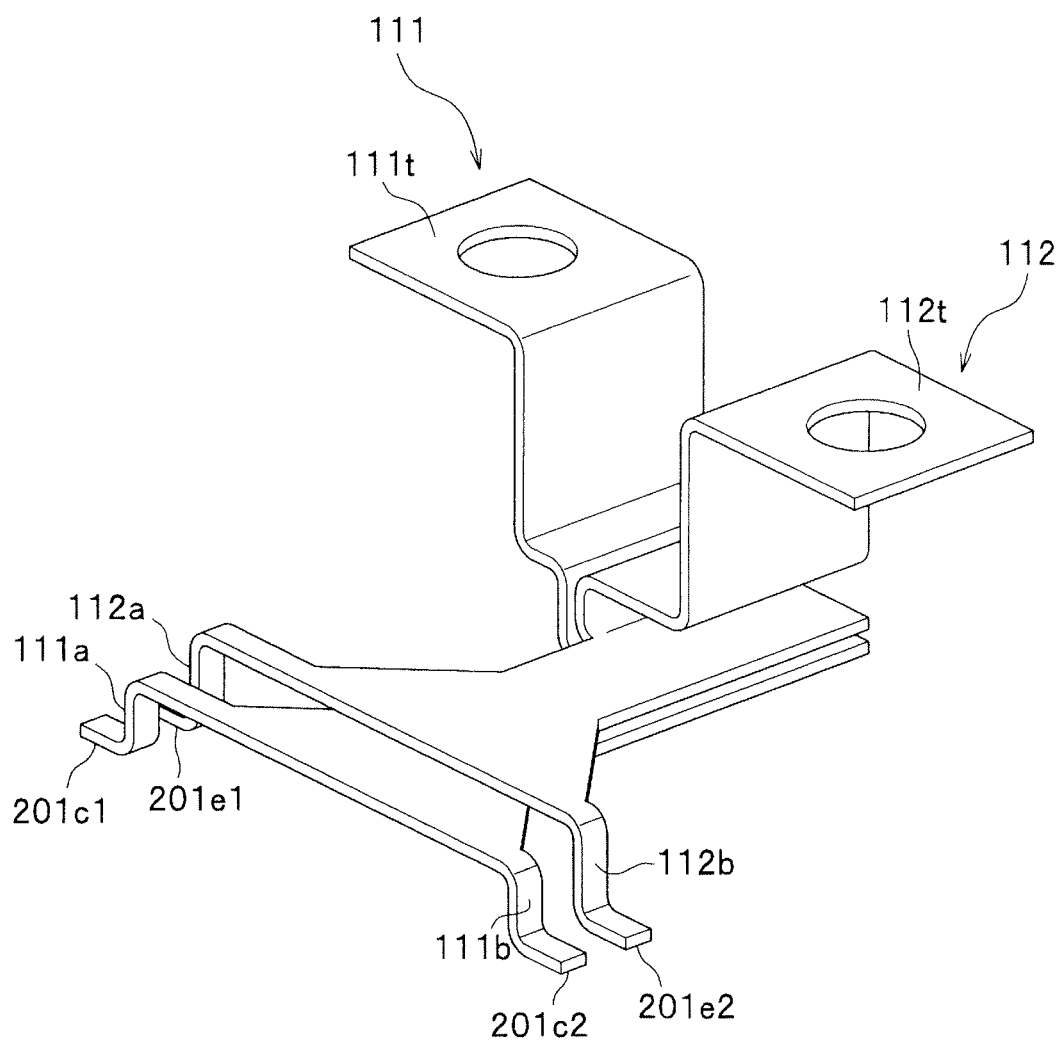
FIG. 5 is a perspective view of a collector electrode and an emitter electrode used in the power semiconductor device of the embodiment 1.
Figure 6:
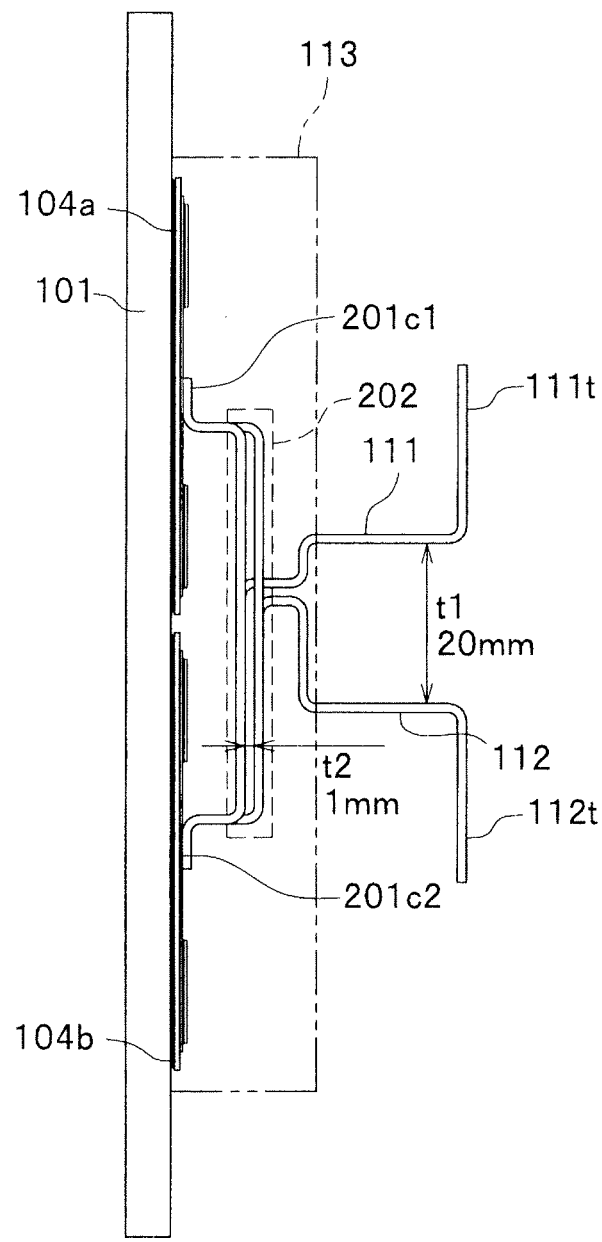
FIG. 6 is a front view of the power semiconductor device of the embodiment 1.
Figure 7:
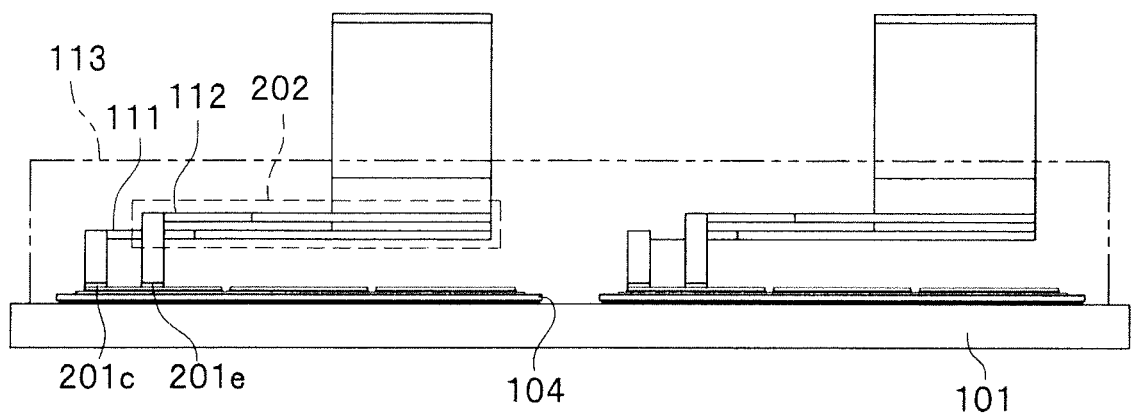
FIG. 7 is a side view of the power semiconductor device of the embodiment 1.
Figure 16:
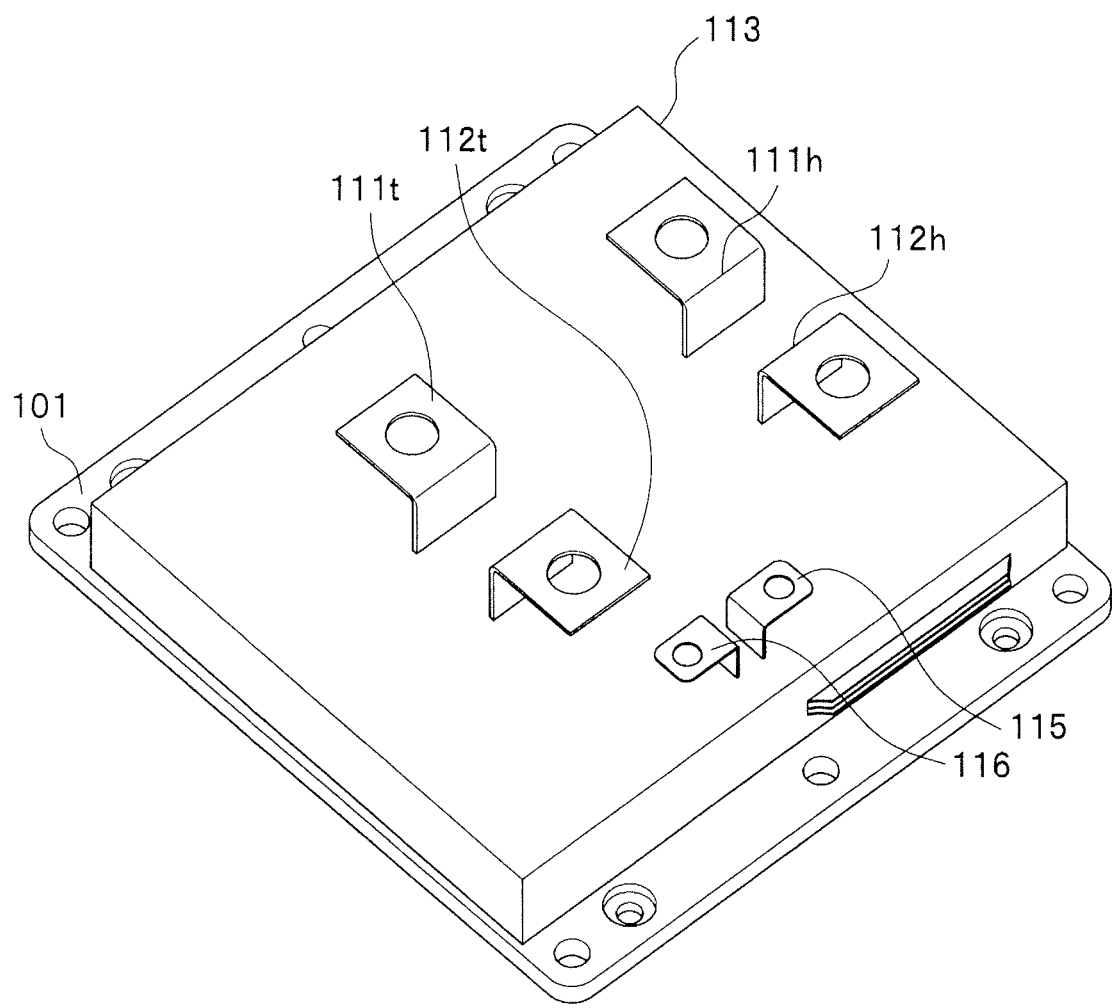
FIG. 16 is a perspective view of an outer appearance of the power semiconductor device of FIG. 1.

A power semiconductor device of embodiment 1 will be described with reference to FIG. 1 to FIG. 7 and FIG. 16. FIG. 1 is a perspective view of the power semiconductor device of the embodiment 1. FIG. 2 is a plan view of a chip mounted substrate 104 used in the power semiconductor device of the embodiment 1. FIG. 3 is an A-A sectional view of FIG. 1. FIG. 4 is a plan view of the power semiconductor device of the embodiment 1. FIG. 5 is a perspective view of a collector electrode 111 and an emitter electrode 112 used in the power semiconductor device of the embodiment 1. FIG. 6 is a front view of the power semiconductor device of the embodiment 1. FIG. 7 is a side view of the power semiconductor device of the embodiment 1. Further, FIG. 16 is a perspective view of the outer appearance of the power semiconductor device of FIG. 1. In FIG. 1 to FIG. 7, a bonding wire is not shown except for a case where the bonding wire is necessary for explanation of the chip mounted substrate 104. Besides, FIG. 6 and FIG. 7 do not show a gate electrode 115 and an emitter sense electrode 116.

A schematic structure of the power semiconductor device of the embodiment 1 will be described.

As shown in FIG. 1, the power semiconductor device includes a heat sink base plate 101, a chip mounted substrate 104 (a first chip mounted substrate 104a, a second chip mounted substrate 104b), a collector electrode 111, an emitter electrode 112, an insulating material 113, a gate electrode 115, an emitter sense electrode 116, a gate electrode contacting wire 121, an emitter sense electrode contacting wire 122, and a not-shown case covering the periphery of the insulating material 113. Incidentally, the chip mounted substrate 104 is joined on the heat sink base plate 101 by an under substrate solder 102 (see FIG. 3).

As shown in FIG. 2, the chip mounted substrate 104 includes, on an insulating layer 114, a collector trace 105 (coarse shaded portion), an emitter trace 106 (dense shaded portion), a switching device 108, a free wheeling diode 109, a gate trace 117, an emitter sense trace 118, an emitter wire 110, a gate wire 119, and an emitter sense wire 120. A collector electrode joint region 201c exists on the collector trace 105, and an emitter electrode joint region 201e exists on the emitter trace 106.

Incidentally, in the chip mounted substrate 104, as shown in FIG. 3 (A-A sectional view of FIG. 1), a metal film 103 under the substrate, the insulating layer 114, the collector trace 105, an under chip solder 107, and the switching device 108 (free wheeling diode 109) are arranged in this order from lower to upper. The chip mounted substrate 104 is mounted on the heat sink base plate 101 through the under substrate solder 102.

In this example, as shown in FIG. 4, in the power semiconductor device, the size of the heat sink base plate 101 is 140 mm (up-and-down direction)×130 mm (right-and-left direction), and four chip mounted substrates 104 each having a size of 50 mm (up-and-down direction)×55 mm (right-and-left direction) are mounted thereon. Two pairs of the collector electrodes 111 and the emitter electrodes 112 are provided, and one pair of the collector electrode 111 and the emitter electrode 112 parallelly connect the two chip mounted substrates 104 (the first chip mounted substrate 104a, the second chip mounted substrate 104b).

The collector electrode 111 and the emitter electrode 112 respectively have the shapes as shown in FIG. 5. In this embodiment, a bonding face 111t on collector electrode and a bonding face 112t on emitter electrode are provided as electric connection faces of the collector electrode 111 and the emitter electrode 112 to the outside. Besides, a joint region between the collector trace 105 (see FIG. 2) and the collector electrode 111 and a joint region between the emitter trace 106 (see FIG. 2) and the emitter electrode 112 are respectively called the collector electrode joint region 201c (see FIG. 2) and the emitter electrode joint region 201e (see FIG. 2). In FIG. 5, since the collector electrode 111 is connected in parallel to the plural collector traces 105, collector electrode joint regions 201c1 and 201c2 are provided. Similarly, the emitter electrode 112 includes emitter electrode joint regions 201e1 and 201e2. Incidentally, portions extending upward from the collector electrode joint regions 201c1 and 201c2 are called foot regions 111a and 111b, and portions extending upward from the emitter electrode joint regions 201e1 and 201e2 are called foot regions 112a and 112b.

As shown in FIG. 2, the four switching devices 108 formed of IGBTs are mounted on the one chip mounted substrate 104, and connected in parallel to each other by the collector trace 105 and the emitter trace 106. One IGBT can allow a current of 75 A at most to flow, and accordingly, one substrate can allow a current of 300 A at most to flow. That is, one pair of the collector electrode 111 and the emitter electrode 112 can allow a current of 600 A at most to flow, and the whole power semiconductor device can allow a current of 1200 A at most to flow.

Here, the detailed electrical connection relation of the power semiconductor device of the embodiment will be described with reference to FIG. 1, FIG. 3 and FIG. 5. As shown in FIG. 1, the collector electrode 111 is jointed to the collector trace 105 on the chip mounted substrate 104. The emitter electrode 112 is connected to the emitter trace 106 on the chip mounted substrate 104.

The back surface of the switching device 108 is a collector electrode pad, and is connected to the collector trace 105 (see FIG. 3) through the under chip solder 107 (see FIG. 3). The front surface of the switching device 108 is an emitter electrode pad, and as shown in FIG. 2, the emitter electrode pad is connected to the emitter trace 106 through the emitter wire 110, and is further connected to the emitter sense trace 118 through the emitter sense wire 120. Besides, a gate electrode pad exists on the front surface of the switching device 108, and is connected to the gate trace 117 through the gate wire 119. The back surface of the free wheeling diode 109 shown in FIG. 2 is a cathode electrode pad, and is connected to the collector trace 105 through the under chip solder 107. Besides, the front surface of the free wheeling diode 109 is an anode electrode pad, and is connected to the emitter trace 106 through the emitter wire 110 as shown in FIG. 2.

As shown in FIG. 1, the gate trace 117 and the emitter sense trace 118 are respectively connected to the gate electrode 115 and the emitter sense electrode 116 through the gate electrode contacting wire 121 and the emitter sense electrode contacting wire 122.

Hereinafter, the functions and materials of the respective components will be described with reference to FIG. 1 and FIG. 3, and other drawings when necessary.

The heat sink base plate 101 conducts heat generated from the switching device 108 and the free wheeling diode 109 to a cooler provided on the back surface of the heat sink base plate 101, and serves to ensure the structural strength. Aluminum, copper, alloy of aluminum and silicon carbide or the like is used as the material.

The under substrate solder 102 is a member to connect the heat sink base plate 101 and the metal film 103 under the substrate of the chip mounted substrate 104, and eutectic solder, lead-free solder, silver or the like is used as the material.

The metal film 103 under the substrate is a metal solid film brazed to the back side of the insulating layer 114 and having a thickness of about 200 micrometers, and is joined to the heat sink base plate 101 through the under substrate solder 102. Copper or aluminum is used as the material.

The insulating layer 114 functions to electrically insulate a circuit trace pattern, such as the collector trace 105, from the heat sink base plate 101 and functions to mount a semiconductor chip. The insulating layer is a ceramic plate having a thickness of about 500 micrometers to 800 micrometers. The metal film 103 under the substrate is provided on the back side thereof, and the collector trace 105, the emitter trace 106, the gate trace 117 and the like, which are circuit trace patterns, are provided on the front side thereof. Aluminum nitride (AlN), silicon nitride ($Si_3N_4$), aluminum oxide ($Al_2O_3$) or the like is used as the material of the insulating layer 114.

The collector trace 105 and the emitter trace 106 are copper or aluminum trace patterns having a thickness of about 300 micrometers.

The under chip solder 107 is a joint material to connect the collector trace to the collector electrode pad of the switching device 108 and the cathode electrode pad of the free wheeling diode 109. An eutectic solder or lead-free solder having a thickness of about 200 micrometers, silver having a thickness of several to several tens micrometers, or the like is used.

The switching device 108 includes the gate electrode pad, the collector electrode pad and the emitter electrode pad, and when a voltage between the gate electrode pad and the emitter electrode pad exceeds a threshold voltage, the resistance between the collector electrode pad and the emitter electrode pad becomes small, and current can flow. On the contrary, when the voltage between the gate electrode pad and the emitter electrode pad becomes lower than the threshold voltage, the resistance between the collector electrode pad and the emitter electrode pad becomes large, and the current is blocked.

The switching device 108 of the embodiment is the IGBT (Insulated Gate Bipolar Transistor). However, the kind of the switching device is not limited to this, and any device can be used as long as it can switch on/off a current. For example, a power MOSFET (Metal Oxide Semiconductor Field Effect Transistor) can be used. The free wheeling diode 109 functions to cause the current of load inductance, such as a motor, to flow back.

A wire such as the emitter wire 110 (see FIG. 2) serves to realize electrical connection as stated above, and is a metal material to electrically connect a trace and an electrode, an electrode and an electrode, or a trace and a trace by a wire bonding step. For example, an aluminum wire having a diameter of about 500 micrometers or a copper wire is used.

The bonding face 111t on collector electrode is an electric connection face to the outside, and the collector electrode 111 functions to cause a current from the outside to flow to the collector trace 105. The collector electrode 111 electrically parallelly connect the collector traces 105 of the two chip mounted substrates 104 (the first chip mounted substrate 104a and the second chip mounted substrate 104b).

The bonding face 112t on emitter electrode is an electric connection face to the outside, and functions to cause a current from the outside to flow to the emitter trace 106. Besides, the emitter electrode 112 electrically parallelly connect the emitter traces 106 of the first chip mounted substrate 104a and the second chip mounted substrate 104b. The collector electrode 111 and the emitter electrode 112 are mainly made of a metal such as aluminum or copper, and have a thickness of about 1 millimeter to 2 millimeters.

Eutectic solder or lead-free solder is used for the joint between the collector electrode 111 and the collector trace 105 and between the emitter electrode 112 and the emitter trace 106. In the case of solder joint, the collector electrode 111 and the emitter electrode 112 are subjected to nickel plating. Besides, direct joining can be performed by using an ultrasonic joining method without using a joining material such as solder.

The ultrasonic joining method is a technique of performing metal joining by applying ultrasonic and pressure to a connection portion to remove oxide films of the collector electrode 111 and the emitter electrode 112, and the collector trace 105 and the emitter trace 106 which are connection objects. In this embodiment, a joint material is not used, and the ultrasonic connection method is used to connect the collector electrode 111 and the emitter electrode 112 to the collector trace 105 and the emitter trace 106. The direct joining is performed without using the joint material, so that the cost can be reduced, the thermal conductivity of the connection portion is improved, and the reliability can be further improved.

The insulating material 113 (indicated by a two-dot chain line in FIG. 1) is filled in the power semiconductor device in order to prevent discharge due to high voltage. A gel material such as polysiloxane or an epoxy resin is used as the material. The insulating material 113 is filled from the surface of the heat sink base plate 101 to the height shown in FIG. 6. Since a voltage of several thousand volts is applied between the collector electrode 111 and the emitter electrode 112, an interval (first interval t1) between the collector electrode 111 and the emitter electrode 112 outside the insulating material 113 is about 20 mm in order to prevent a discharge. In the inside of the insulating material 113, an interval (second interval t2) between the collector electrode 111 and the emitter electrode 112 is about 1 mm.

As shown in FIG. 4, in the power semiconductor device of the embodiment, when the bonding face 111t on collector electrode is on an upper side, and the bonding face 112t on emitter electrode is on a lower side, the joint region 201c (see FIG. 2) between the collector trace 105 on the chip mounted substrate 104 and the collector electrode 111, and the joint region 201e (see FIG. 2) between the emitter trace and the emitter electrode are located at the same position in the up-and-down direction, and are adjacent in the right-and-left direction at an interval of 4 mm. Besides, the collector electrode joint region 201c1 (see FIG. 5) on the first chip mounted substrate 104a and the collector electrode joint region 201c2 (see FIG. 5) on the second chip mounted substrate 104b, and the emitter electrode joint region 201e1 (see FIG. 5) on the first chip mounted substrate 104a and the emitter joint region 201e2 (see FIG. 5) on the second chip mounted substrate 104b are respectively located at the same positions in the right-and-left direction.

The electrode joint regions are arranged as stated above, so that a difference between a current distribution, on the collector electrode 111 and the emitter electrode 111, of a current flowing through the first chip mounted substrate 104a and a current distribution, on the collector electrode 111 and the emitter electrode 112, of a current flowing through the second chip mounted substrate 104b can be made small. Thus, an inductance difference between the respective paths becomes small, and unbalance between the current flowing through the chip mounted substrate 104a and the current flowing through the chip mounted substrate 104b can be reduced.

In this embodiment, as shown in FIG. 2, although the interval between the collector electrode joint region 201c and the emitter electrode joint region 201e is 4 mm, the interval can be further decreased within a range in which through-discharge between the collector electrode 111 and the emitter electrode 112 does not occur.

In this embodiment, since a voltage between the collector and the emitter is 3.3 kV at most, in order to avoid creeping discharge, the interval between the collector trace 105 and the emitter trace 106 is 2 mm as shown in FIG. 2. Since the collector electrode joint region 201c and the emitter electrode joint region 201e are respectively located 1 mm inside the ends of the collector trace 105 and the emitter trace 106 in order to provide the matching margin of the joint region, the interval is 4 mm. However, for example, the matching accuracy of the joint region is improved, and if the side of the collector electrode joint region 201c and the side of the emitter electrode joint region 201e, on which the collector trace 105 and the emitter trace 106 face each other, are made coincident with the ends of the traces and joined with each other, the interval can be made 2 mm.

Further, in this embodiment, as shown in FIG. 6, the collector electrode 111 and the emitter electrode 112 include a superimposed region 202 parallel to the chip mounted substrate 104 (104a, 104b) surface in the inside of the insulating material 113. In the superimposed region 202, the collector electrode 111 and the emitter electrode 112 are stacked with in interval of 1 mm. In the superimposed region 202, since the current of the collector electrode 111 and the current of the emitter electrode 112 flow in opposite directions, the inductance can be reduced by mutual inductance. As the distance between the collector electrode 111 and the emitter electrode 112 in the superimposed region 202 becomes small, the inductance can be reduced, and the distance is desirably 2 mm or less. However, a distance of 1 mm or more is required in order to prevent the through-discharge between the collector electrode 111 and the emitter electrode 112. Incidentally, FIG. 7 is a side view of the power semiconductor device and the position of the superimposed region 202 is shown.

Besides, as shown in FIG. 5, in both the collector electrode 111 and the emitter electrode 112, the foot regions (for example, the foot regions 111a, 111b, 112a and 112b (see FIG. 1 and FIG. 5)) extending from the superimposed region 202 (see FIG. 6) to the electrode joint regions are arranged at the upper side on the upper substrate and at the lower side on the lower substrate. That is, in each of the upper substrate and the lower substrate, the foot region of the collector electrode 111 and the foot region of the emitter electrode 112 (for example, the foot regions 111a and 112a, or the foot regions 111b and 112b) are adjacent to each other and have the same shape and the same direction. Thus, the inductance of the foot region can be reduced by mutual inductance.

Besides, in this embodiment, as shown in FIG. 1, the collector electrode 111 and the emitter electrode 112 are bent at mutually facing sides 111h and 112h of the bonding face 111t on the collector electrode and the bonding face 112t on the emitter electrode, and are connected to the superimposed region 202 (see FIG. 6). Since the electrodes are bent at the mutually facing sides of the bonding face 111t on the collector electrode and the bonding face 112t on the emitter electrode, a difference between a current path from the bonding face 111t on the collector electrode to the collector electrode joint region 201c1 (see FIG. 6) on the first chip mounted substrate 104a and a current path from the bonding face 111t on the collector electrode to the collector electrode joint region 201c2 (see FIG. 6) on the second chip mounted substrate 104b is smallest as compared with a case of bending from other sides. As a result, an inductance difference between the current path from the bonding face 111t on the collector electrode to the first chip mounted substrate 104a and the current path from the bonding face 111t on the collector electrode to the second chip mounted substrate 104b becomes small, and accordingly, the current balance is improved.

Besides, in the power semiconductor device of the embodiment, as shown in FIG. 4 and FIG. 5, the position of the collector electrode joint region 201c1 on the first chip mounted substrate 104a and the position of the collector electrode joint region 201c2 on the second chip mounted substrate 104b are respectively provided at the center of the chip mounted substrate 104 in the up-and-down direction. Since the position of the collector electrode joint region 201c1 on the first chip mounted substrate 104a and the position of the collector electrode joint region 201c2 on the second chip mounted substrate 104b are respectively provided at the center of the chip mounted substrate 104 in the up-and-down direction, a difference in trace length from the respective electrode joint regions to the respective switching devices 108 and the respective free wheeling diodes 109 can be made small, and accordingly, the current balance can be improved.

In this embodiment, as shown in FIG. 4 and FIG. 5, the position of the collector electrode joint region 201c1 on the first chip mounted substrate 104a and the position of the collector electrode joint region 201c2 on the second chip mounted substrate 104b are respectively provided at the center of the chip mounted substrate 104 in the up-and-down direction, the four switching devices 108 are divided into two on the upper side of the substrate and two on the lower side of the substrate, and the electrode joint region is provided at the center in the up-and-down direction. Thus, trace distances from the electrode joint regions to the respective switching devices 108 become symmetrical, and the current balance is improved.

Besides, the two switching devices 108 of the upper switching devices 108 and the two switching devices 108 of the lower switching devices 108 are respectively divided to the left end and the right end and are arranged, and the free wheeling diode 109 is arranged between the switching devices 108 at the left end and the right end. By the arrangement as stated above, the intervals between the four switching devices 108, and the interval between the two free wheeling diodes 109 can be lengthened. In the power semiconductor device, the switching device 108 and the free wheeling diode 109 temporarily alternately generate heat. Accordingly, the interval between the same kinds of chips is lengthened, so that temperature rise by heat interference due to mutual heat generation can be suppressed, and the reliability can be improved.

Embodiment 2

Figure 8:
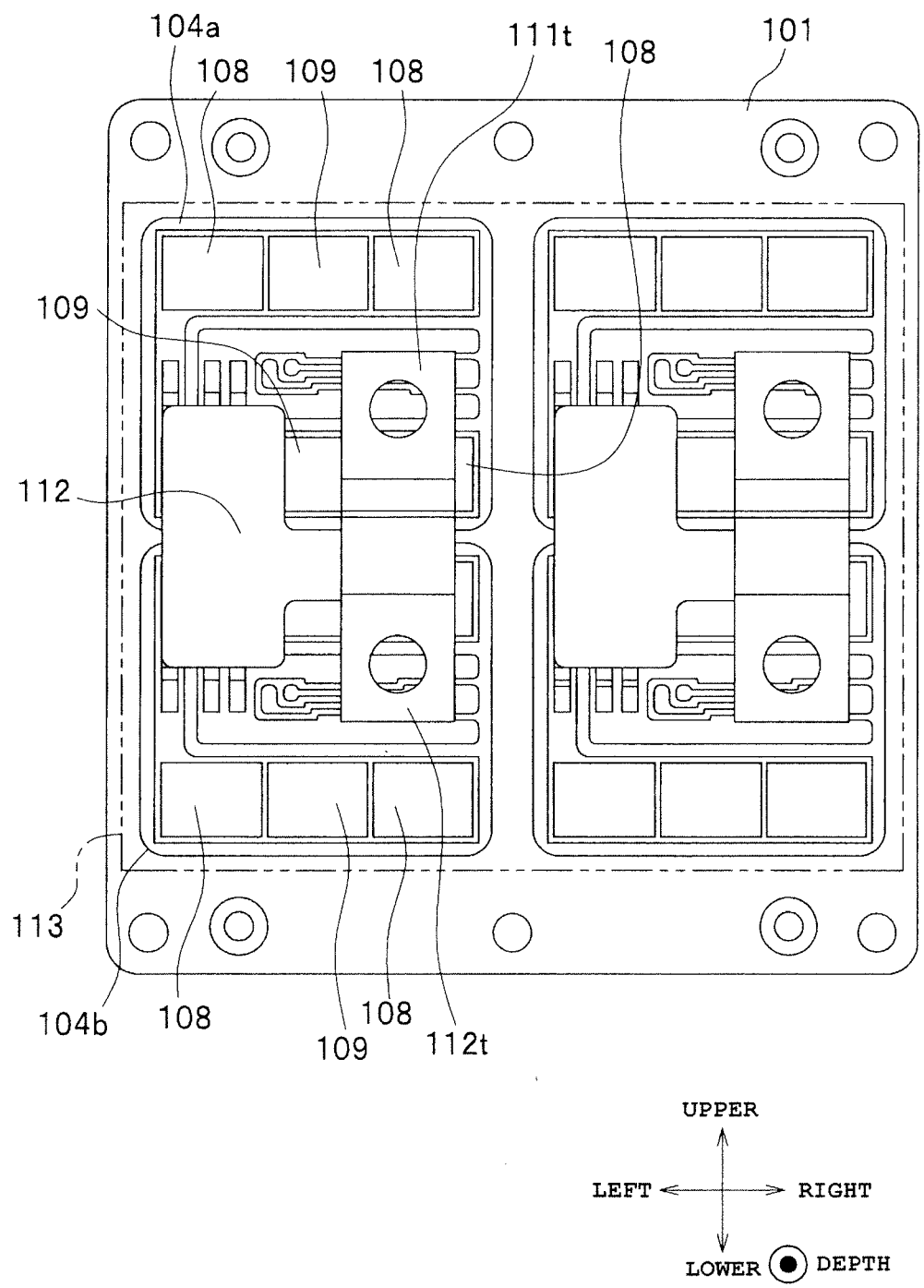
FIG. 8 is a plan view of a power semiconductor device of embodiment 2.
Figure 9:
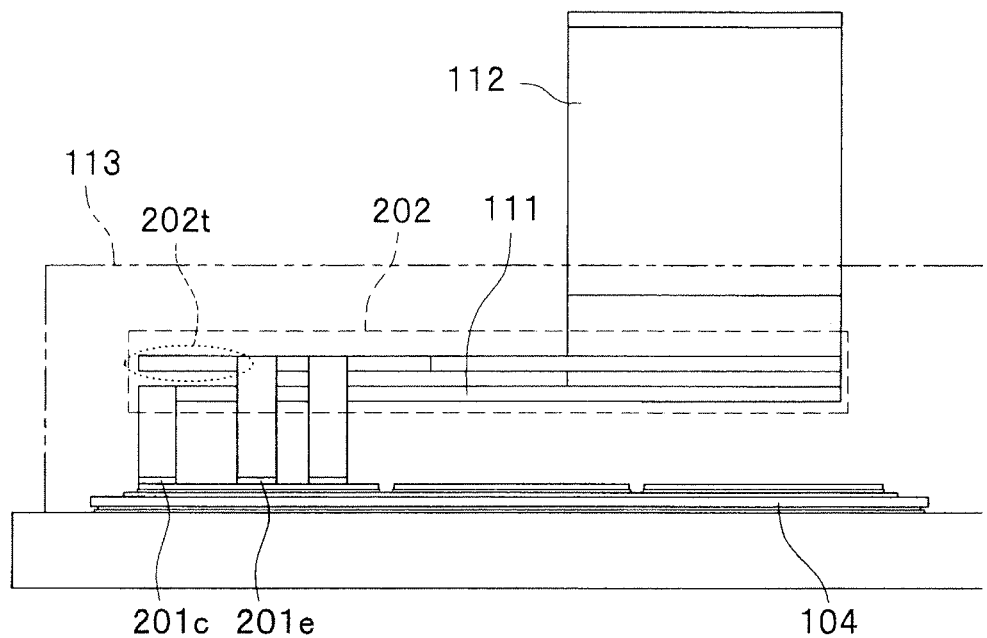
FIG. 9 is a side view of the power semiconductor device of the embodiment 2.
Figure 10:
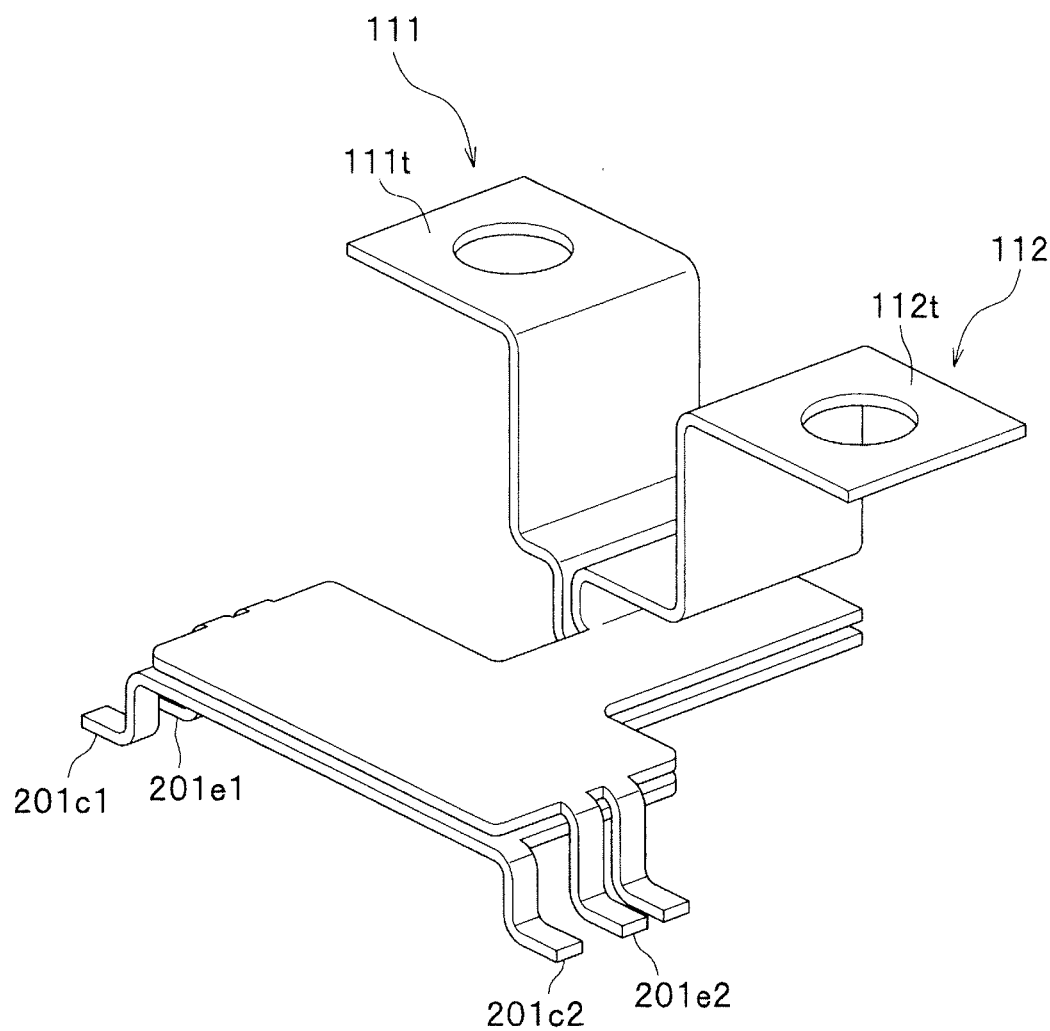
FIG. 10 is a perspective view of a collector electrode and an emitter electrode used in the power semiconductor device of the embodiment 2.

FIG. 8 is a plan view of a power semiconductor device of embodiment 2. FIG. 9 is a side view of the power semiconductor device of the embodiment 2. FIG. 10 is a perspective view of a collector electrode 111 and an emitter electrode 112 used in the power semiconductor device of the embodiment 2. The structure of the power semiconductor device of the embodiment 2 is similar to the power semiconductor device of the embodiment 1 except for the shape of the collector electrode 111 and the emitter electrode 112. Thus, the illustration of a gate electrode and an emitter sense electrode is omitted.

The feature of the embodiment 2 will be described with reference to FIG. 9. In the power semiconductor device of the embodiment 2, in a collector electrode joint region 201c and an emitter electrode joint region 201e, a superimposed region 202 of an electrode including an electrode joint region at a position closer to an electrode bonding face extends to the end, in the right-and-left direction, of an electrode joint region of an electrode including the electrode joint region at a position farther from an electrode bonding face. With reference to the perspective view shown in FIG. 10, it is understood that the superimposed region 202 (see FIG. 9) has a parallel plate shape.

That is, as in a portion encircled by an elliptical dotted line frame of FIG. 9, the superimposed region 202 of the emitter electrode 112 including the electrode joint region at the position closer to the electrode bonding face includes a projection 202t extending to the left end position of the electrode joint region of the collector electrode 111 including the electrode joint region at the position farther from the electrode bonding face. As stated above, the superimposed region 202 of the emitter electrode 112 is extended, so that a current in the opposite direction to a current flowing through the collector electrode 111 under the extended portion flows through the extended portion, and there is an effect to reduce inductance. Incidentally, in FIG. 10, plural emitter electrode joint regions 201e (201e1, 201e2) are provided in order to reduce resistance.

Embodiment 3

Figure 11:
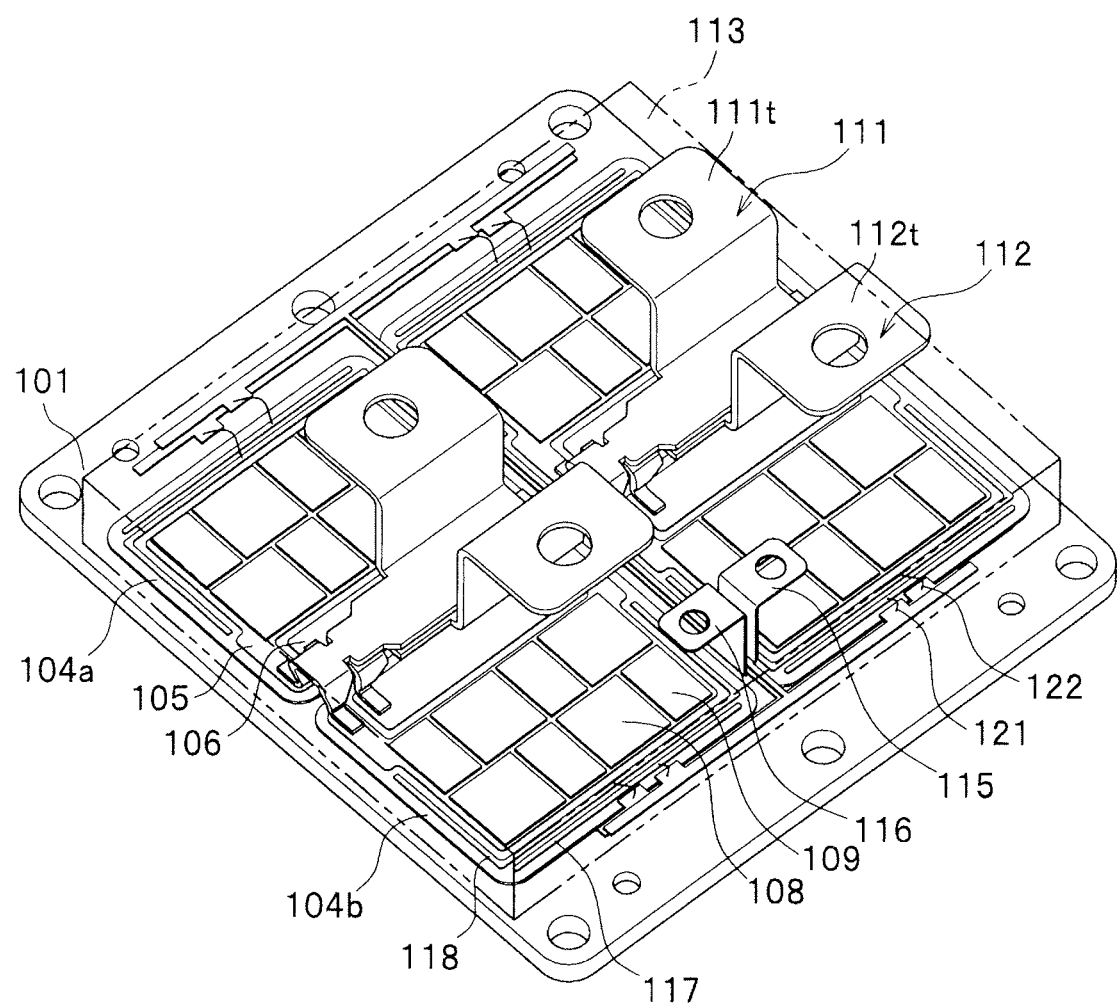
FIG. 11 is a perspective view of a power semiconductor device of embodiment 3.
Figure 14:
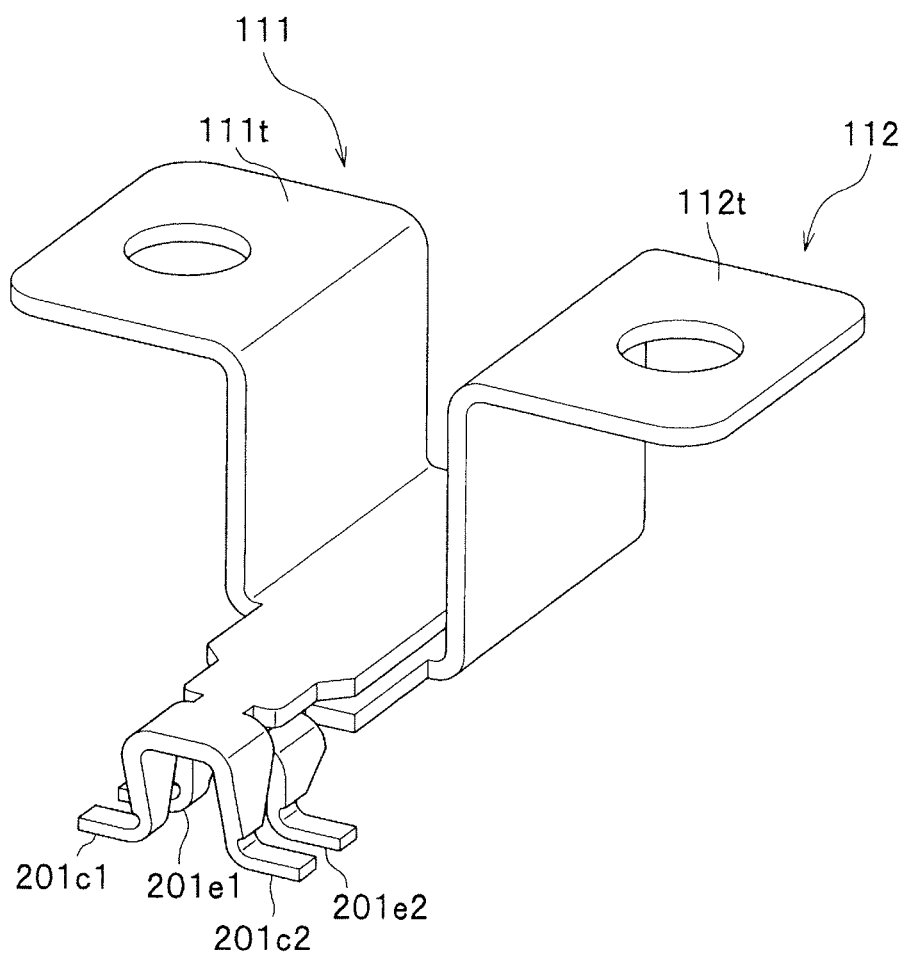
FIG. 14 is a perspective view of a collector electrode and an emitter electrode used in the power semiconductor device of the embodiment 3.

FIG. 11 is a perspective view of a power semiconductor device of embodiment 3. FIG. 12 is a plan view of the power semiconductor device of the embodiment 3. FIG. 13 is a plan view of a chip mounted substrate 104 used in the power semiconductor device of the embodiment 3. FIG. 14 is a perspective view of a collector electrode 111 and an emitter electrode 112 used in the power semiconductor device of the embodiment 3. FIG. 11 and FIG. 12 do not show a bonding wire on the chip mounted substrate 104.

The basic structure of the power semiconductor device of the embodiment 3 is similar to the power semiconductor device of the embodiment 1 except for the shape of the collector electrode 111 and the emitter electrode 112, and the layout of switching devices 108 and free wheeling diodes 109 on the chip mounted substrate 104.

In the power semiconductor device of the embodiment 3, a collector electrode joint region 201c1 (see FIG. 14) is provided at a left end region in a right-and-left direction and a lower region in an up-and-down direction on a first chip mounted substrate 104a (see FIG. 11, FIG. 12) arranged at an upper side. A collector electrode joint region 201c2 (see FIG. 14) is provided at a left end region in the right-and-left direction and an upper region in the up-and-down direction on a chip mounted substrate 104b (see FIG. 11, FIG. 12) arranged on a lower side. As a result, a distance between the electrode joint region on the upper chip mounted substrate 104a and the electrode joint region on the lower chip mounted substrate 104b becomes short and the inductance can be further reduced.

Besides, in the embodiment 3, as shown in FIG. 13, four switching devices 108 and four free wheeling diodes 109 are mounted on an insulating substrate, and the switching devices 108 and the free wheeling diodes 109 are alternately arranged in the up-and-down direction and the right-and-left direction. As a result, since adjacent regions between the switching devices 108 and between the free wheeling diodes 109 are reduced, temperature rise by the mutual heating of the switching devices 108 and temperature rise by the mutual heating of the free wheeling diodes 109 are reduced, and therefore, the reliability is improved.

The power semiconductor device of the embodiment includes the first chip mounted substrate 104a on which the switching device 108 and the free wheeling diode 109 are mounted, the second chip mounted substrate 104b on which the switching device 108 and the free wheeling diode 109 are mounted, a pair of the collector electrode 111 and the emitter electrode 112 to electrically parallelly connect the collector traces 105 and the emitter traces 106 on the two chip mounted substrates, and the filled insulating material 113 (see FIG. 1). The collector electrode 111 and the emitter electrode 112 face each other, the first interval t1 is provided outside the insulating material 113, and the second interval t2 smaller than the first interval t1 is provided inside the insulating material 113 (see FIG. 6). When the collector electrode terminal is on the upper side and the emitter electrode terminal is on the lower side when viewed in plane (for example, when the bonding face 111*t* on the collector electrode is on the upper side, and the bonding face 112*t* on the emitter electrode is on the lower side, see FIG. 1, FIG. 4), the collector electrode joint region 201*c* as the joint region between the collector trace 105 and the collector electrode 111 on the chip mounted substrate 104 and the emitter electrode joint region 201*e* as the joint region between the emitter trace 106 and the emitter electrode 112 are located at the same position in the up-and-down direction and are adjacent in the right-and-left direction at an interval of 2 mm or more and 4 mm or less (see FIG. 2). Besides, the collector electrode joint region 201*c*1 on the first chip mounted substrate 104*a* arranged at the upper side and the collector electrode joint region 201*c*2 on the second chip mounted substrate 104*b* arranged at the lower side, and the emitter electrode joint region 201*e*1 on the first chip mounted substrate 104*a* and the emitter electrode joint region 201*e*2 on the second chip mounted substrate 104*b* are respectively arranged at the same positions in the right-and-left direction (see FIG. 4, FIG. 5).

The power semiconductor device of the embodiment includes the first chip mounted substrate 104*a* on which the switching device 108 and the free wheeling diode 109 are mounted, the second chip mounted substrate 104*b* on which the switching device 108 and the free wheeling diode 109 are mounted, a pair of the collector electrode 111 and the emitter electrode 112 to electrically parallelly connect the collector traces 105 and the emitter traces 106 on the two chip mounted substrates 104, and the filled insulating material 113. The collector electrode 111 and the emitter electrode 112 face each other, the first interval t1 is provided outside the insulating material 113, and the second interval t2 smaller than the first interval t1 is provided inside the insulating material 113. The collector electrode 111 and the emitter electrode 112 respectively include the electrode bonding faces (for example, the bonding face 111*t* on the collector electrode and the bonding face 112*t* on the emitter electrode) as the electric connection faces outside the insulating material 113, and respectively include surfaces parallel to the chip mounted substrate 104 inside the insulating material 113. The surfaces of the collector electrode 111 and the emitter electrode 112 parallel to the chip mounted substrate 104 have the superimposed region 202 in which a distance of 1 mm or more and 2 mm or less is provided. In the joint region 201*c* between the collector electrode 111 and the collector trace 105 and the joint region 201*e* between the emitter electrode 112 and the emitter trace 106, the surface, parallel to the chip mounted substrate 104, of the electrode including the electrode joint region at the position closer to the electrode bonding face includes the projection 202*t* (see FIG. 9) extending to the end position of the electrode joint region of the electrode including the electrode joint region at the position farther from the electrode bonding face.

What is claimed is:

1. A power semiconductor device comprising:
 a first chip mounted substrate on which a switching device and a free wheeling diode are mounted;
 a second chip mounted substrate on which a switching device and a free wheeling diode are mounted;
 a pair of a collector electrode and an emitter electrode to electrically parallelly connect collector traces and emitter traces on the two chip mounted substrates; and
 a filled insulating material, wherein
 the collector electrode and the emitter electrode face each other, a first interval is provided outside the insulating material, and a second interval smaller than the first interval is provided inside the insulating material,
 when a collector electrode terminal is on an upper side and an emitter electrode terminal is on a lower side when viewed in plane, a collector electrode joint region as a joint region between the collector trace and the collector electrode on the chip mounted substrate and an emitter electrode joint region as a joint region between the emitter trace and the emitter electrode are located at a same position in an up-and-down direction and are adjacent in a right-and-left direction at an interval of 2 mm or more and 4 mm or less, and
 the collector electrode joint region on the first chip mounted substrate arranged on the upper side and the collector electrode joint region on the second chip mounted substrate arranged on the lower side, and the emitter electrode joint region on the first chip mounted substrate and the emitter electrode joint region on the second chip mounted substrate are respectively arranged at same positions in the right-and-left direction.

2. The power semiconductor device according to claim 1, wherein the collector electrode and the emitter electrode respectively include surfaces parallel to a surface of the chip mounted substrate inside the insulating material, and the surfaces of the collector electrode and the emitter electrode parallel to the chip mounted substrate have a superimposed region in which a distance of 1 mm or more and 2 mm or less is provided as the second interval.

3. The power semiconductor device according to claim 2, wherein the collector electrode and the emitter electrode include foot regions to connect the surfaces parallel to the chip mounted substrate inside the insulating material and the joint regions joined to the traces, the foot region connected to the first chip mounted substrate arranged on the upper side is extracted upward, and the foot region connected to the second chip mounted substrate arranged on the lower side is extracted downward.

4. The power semiconductor device according to claim 3, wherein in the collector electrode joint region and the emitter electrode joint region, the surface, parallel to the chip mounted substrate, of the electrode including the electrode joint region at a position closer to an electrode bonding face in the right-and-left direction includes a projection extending to an end position, in the right-and-left direction, of the electrode joint region of the electrode including the electrode joint region at a position farther from an electrode bonding face.

5. The power semiconductor device according to claim 3, wherein the collector electrode and the emitter electrode include electrode bonding faces parallel to the chip mounted substrate outside the insulating material, are bent toward the chip mounted substrate at sides of the electrode bonding faces facing each other, and are inserted in the insulating material.

6. The power semiconductor device according to claim 1, wherein the collector electrode joint region is provided on the chip mounted substrate at a left end region in the right-and-left direction and a center region in the up-and-down direction.

7. The power semiconductor device according to claim 1, wherein the collector electrode joint region is provided at a left end region in the right-and-left direction and a lower region in the up-and-down direction on the first chip mounted substrate arranged on the upper side, and the collector electrode joint region is provided at a left end region in the right-and-left direction and an upper region in the up-and-down direction on the second chip mounted substrate arranged on the lower side.

8. The power semiconductor device according to claim 6, wherein four switching devices and two free wheeling diodes are mounted on the chip mounted substrate, the switching devices are mounted at an upper left end, a lower left end, an upper right end and a lower right end on the chip mounted substrate, and the free wheeling diodes are mounted at a center in the right-and-left direction and are mounted at an upper end region in the up-and-down direction and at a lower end region in the up-and-down direction.

9. The power semiconductor device according to claim 7, wherein four switching devices and four free wheeling diodes are mounted on the chip mounted substrate, and the switching devices and the free wheeling diodes are alternately arranged in the up-and-down direction and the right-and-left direction.

10. The power semiconductor device according to claim 2, wherein an insulating resin is inserted between the electrodes in the superimposed region.

11. The power semiconductor device according to claim 1, wherein the switching device is an IGBT (Insulated Gate Bipolar Transistor).

12. The power semiconductor device according to claim 1, wherein the switching device is a power MOSFET (Metal Oxide Semiconductor Field Effect Transistor).

13. A power semiconductor device comprising:
   a first chip mounted substrate on which a switching device and a free wheeling diode are mounted;
   a second chip mounted substrate on which a switching device and a free wheeling diode are mounted;
   a pair of a collector electrode and an emitter electrode to electrically parallelly connect collector traces and emitter traces on the two chip mounted substrates; and
   a filled insulating material, wherein
   the collector electrode and the emitter electrode face each other, a first interval is provided outside the insulating material, and a second interval smaller than the first interval is provided inside the insulating material,
   the collector electrode and the emitter electrode respectively include electrode bonding faces as electric connection faces outside the insulating material, include surfaces parallel to a surface of the chip mounted substrate inside the insulating material, the surfaces of the collector electrode and the emitter electrode parallel to the chip mounted substrate have a superimposed region in which a distance of 1 mm or more and 2 mm or less is provided, and
   in a joint region between the collector electrode and the collector trace and a joint region between the emitter electrode and the emitter trace, the surface, parallel to the chip mounted substrate, of the electrode including the electrode joint region at a position closer to the electrode bonding face includes a projection extending to an end position of the electrode joint region of the electrode including the electrode joint region at a position farther from the electrode bonding face.

* * * * *